US006208213B1

(12) United States Patent
Anastasyev et al.

(10) Patent No.: US 6,208,213 B1
(45) Date of Patent: Mar. 27, 2001

(54) THERMOSTATICALLY CONTROLLED CRYSTAL OSCILLATOR

(75) Inventors: Sergej Vladimirovich Anastasyev; Alexander Anatolyevich Volkov; Yakov Leonidovich Vorokhovsky; Anatoly Ivanovich Dubinchik; Eduard Leontyevich Kitanin, all of St. Petersburg (RU)

(73) Assignee: Otkrytoe Aktsionernoe Obschestvo "Morion" (RU)

( * ) Notice: Subject to any disclaimer, the term of this patent is extended or adjusted under 35 U.S.C. 154(b) by 0 days.

(21) Appl. No.: 09/479,417

(22) Filed: Jan. 7, 2000

(51) Int. Cl.[7] ................................ H03B 5/32; H03L 1/04
(52) U.S. Cl. .............................. 331/69; 331/158
(58) Field of Search ..................... 331/66, 69, 116 R, 331/116 PE, 158, 176, 187; 310/315, 318

(56) References Cited

U.S. PATENT DOCUMENTS

| 4,396,892 | 8/1983 | Frerking et al. | 331/69 |
| 5,025,228 | 6/1991 | Gerard et al. | 331/69 |
| 5,041,800 | 8/1991 | Long et al. | 331/69 |
| 5,729,181 | * | 3/1998 | Cutler et al. | 331/69 |

FOREIGN PATENT DOCUMENTS

| 2587857 | 3/1987 | (FR) . |
| 2081506 | 3/1995 | (RU) . |

* cited by examiner

Primary Examiner—David Mis
(74) Attorney, Agent, or Firm—Welsh & Katz, Ltd.; Thomas W. Tolpin

(57) ABSTRACT

A crystal oscillator consists of an outer housing (1), a circuit board (2) and an inner case (6). The resonator in a separate casing (9) is mounted on the bottom of an inner case. The inner case (6) looks like an inverted open box and is made of material that is an excellent heat conductor. The bottom of the inner case (6) is tightly adjoined to the central part (3) of the circuit board (2). All the thermostatically controlled elements of the oscillator are located in the central part (3) of the circuit board (2). The central part of the circuit board is separated from the peripheral part by means of through cuts (4), both parts being connected at the ends of the cuts with narrow bridging strips (5). Heating elements (10) and a main temperature detector (11) are attached to the side walls of inner case (6), which has heat-conducting rods that pass through the central part (3) of the circuit board (2) in close proximity to each bridging strip (5). The open side of the box (6) is covered by a thin copper cover (12). There is a heat-insulating space between the cover and the body of the crystal resonator (9). A copper cover (13) is attached to the ends of the heat-conducting rods (8) extending from the opposite side of the circuit board (2). There is a heat-insulating space between the cover (13) and the thermostatically controlled elements located on the circuit board (2). The thermostatic regulator is designed as a bridge circuit and has an additional thermosensitive arm with an additional temperature detector (15) located in the peripheral part of the circuit board (2).

9 Claims, 2 Drawing Sheets

THERMOSTATICALLY CONTROLLED CRYSTAL OSCILLATOR

TECHNICAL FIELD

This invention relates to radio electronics and more particular to frequency oscillators with piezoelectric crystal resonators.

BACKGROUND ART

Various versions of stable thermostatically controlled quartz crystal oscillators are known to the prior art (see, for example U.S. Pat. No. 4,985,687 and French Patent No. 2,660,499, 2). To achieve temperature stability up to $\pm 1 \times 10^{-8}$ prior art frequency oscillators usually employed a one-stepped thermostatic circuit. This allows a most simple, economical and compact design of oscillator to be achieved. To achieve stability above $\pm 1 \times 10^{-9}$ a two-stepped thermostatic circuit is used. A higher precision is achieved in this case at the cost of more complex and cumbersome design (see. Ingberman M. I., Fromberg E. M, Graboi L. P., Thermostatic Methods in Communication Technology., M., Sviaz, 1979, page 17, and also Godkov V. D., Gromov S. S., Nikitin N. V., Thermostatic Methods and Wireless Appliances, Moscow, Goskomizdat, 1979, page 46).

RU 2081506 describes a crystal oscillator with a one-stepped thermostatic circuit, which circuit contains a circuit board with elements of the oscillator system mounted thereon. The circuit board is installed in a hermetically sealed outer housing. All temperature controlled elements of the system, including a thermostat with built-in crystal resonator, heating elements, a temperature detector and a thermostatic regulator with a thermosensitive bridge circuit are located in the central part of the circuit board. The central part of the circuit.board is separated from its peripheral part by means of through cuts, both parts being connected at the ends of the cuts by narrow bridging strips.

This oscillator has obvious advantages, such as a simple design, small size and low cost, but it does not allow temperature stability of $\pm 1 \times 10^{-9}$ to be achieved. This limitation is explained by insufficient uniformity of temperature distribution and insufficient precision in maintaining a constant temperature.

SUMMARY OF THE INVENTION

The main object of the present invention is to provide a thermostatically controlled crystal oscillator attaining a high temperature stability of the frequency without use of a double thermostatic circuit.

A more specific object of the present invention is to resolve a technical contradiction between a necessity for uniform temperature distribution at the crystal resonator, which requires placing the resonator out of a thermal flow field, for example by increasing the distance between a crystal resonator and a heater and a necessity for very accurate control of temperature, which requires a temperature detector and the heater being placed as close to the resonator as possible.

It is also a further object of the invention to improve accuracy of temperature control.

The foregoing objects are achieved by using the combination of essential features as specified in independent claims.

Thus, according to one embodiment of the present invention, the required uniformity of the temperature field at the crystal resonator is achieved in a thermostatically controlled crystal oscillator with a circuit board divided into central and a peripheral part by means of through cuts (similar to those employed in the oscillator disclosed in RU 2081506). These parts are joined together at the end of each cut with narrow bridging strips. All thermostatically controlled elements of the oscillator are located in the central part of the circuit board. They include a crystal resonator in a separate casing, and a thermostatic regulator with heating elements. The circuit board is installed in a hermetically sealed outer housing. In addition, according to the present invention, the crystal resonator in the separate casing is tightly adjoined to the bottom of an inner case. This inner case is shaped as an inverted open box made of material that is an excellent heat conductor (or, in other words, possesses a high thermal conductivity). The inner case is fixed to the circuit board using heat-conductive rods, that go through the central part of the circuit board in close proximity to the narrow bridging strips. The bottom of the inner case is tightly adjoined to the circuit board, preferably by a layer of highly heat-conductive glue. The heating elements and a temperature detector are mounted on the outer side walls of the inner case.

Preferably, the open side of the box is covered by a thin cover that is made of material that is an excellent heat conductor, and there is a heat-insulating space between the cover and the body of the crystal resonator. Further, according to the preferred embodiment, a cover is attached to the those ends of the heat-conducting rods which extend from the opposite side of the circuit board. A heat-insulating space is provided between said cover and the thermostatically controlled elements located in the central part of the circuit board, while the cover is made from material of a high thermal conductivity.

Owing to the presence of the above-described features, for any point chosen at random on the surface of thermostatically-controlled elements, a certain matching point can be found along the path of the heat flow being dispersed into the surrounding medium in any possible direction. Said matching point, while having virtually the same temperature as the selected one, is separated from it by a heat-insulating space possessing a large heat resistance. In this way, the crystal oscillator as well as other thermostatically controlled elements of the circuit (also located in the central part of the circuit board) are in a zone of uniform temperature distribution, outside of the heat flow path. This constitutes one of the major preconditions of achieving a high temperature stability.

The described embodiment of the present invention ensures minimum heat loss directly from the surface of the thermostatically controlled elements, and consequently minimises temperature variations through the volume of these elements, especially of the resonator.

According to another embodiment of the present invention, aimed at providing high accuracy of thermostatic regulation, the circuit board of a thermostatically controlled crystal oscillator is divided into a central part and a peripheral part by means of through cuts (similar to those described in RU 2081506). Both parts are joined together at the end of each cut with narrow bridging strips. All thermostatically controlled elements of the oscillator are located in the central part of the circuit board. These elements include a crystal resonator in its own casing, a thermostatic regulator with heating elements and a thermosensitive bridge circuit having a reference arm and a main thermosensitive arm with a main temperature detector. The circuit board is installed in a hermetically sealed outer housing. According to the present invention, the thermosensitive bridge circuit is provided with an additional thermosensitive arm with an additional temperature detector. This additional arm is coupled to the main thermosensitive arm by means of a coupling resistor. The aforementioned additional temperature detector can be installed at any location in the oscillator, as long as the temperature at this location (taken under normal outside conditions) is lower than the temperature of the crystal resonator, at least by 0.5° C.

Introduction of the additional temperature detector makes it possible to minimise the inherent design static error of the thermostatic regulator which is caused by that the heaters are physically remote from the thermostatically controlled elements of the circuit. Moreover, the above-specified temperature difference between the crystal resonator and the additional temperature detector provides the opportunity for the effective tuning of the thermostatic regulator.

The most complete attainment of the above-specified objects of the present invention is ensured by employment of the preferred embodiment of the temperature controlled crystal oscillator according to the present invention as disclosed in claim 9.

BRIEF DESCRIPTION OF THE DRAWINGS

The invention will be further described with reference to attached drawings which show.

BEST MODE FOR CARRYING OUT THE INVENTION

Figure 1:
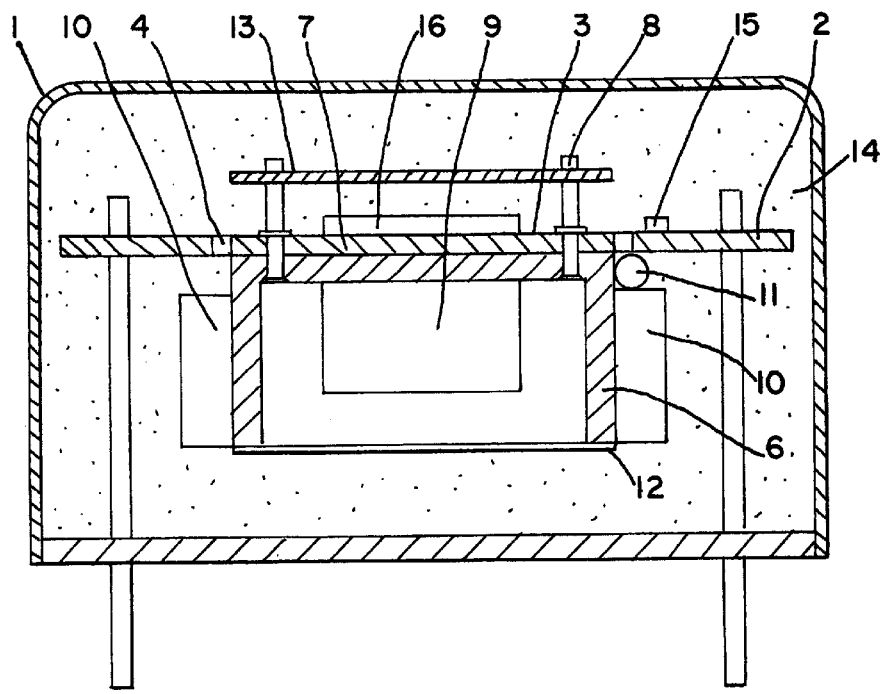
FIG. 1, a simplified general presentation of the crystal oscillator in a cross-sectional view.
Figure 2:
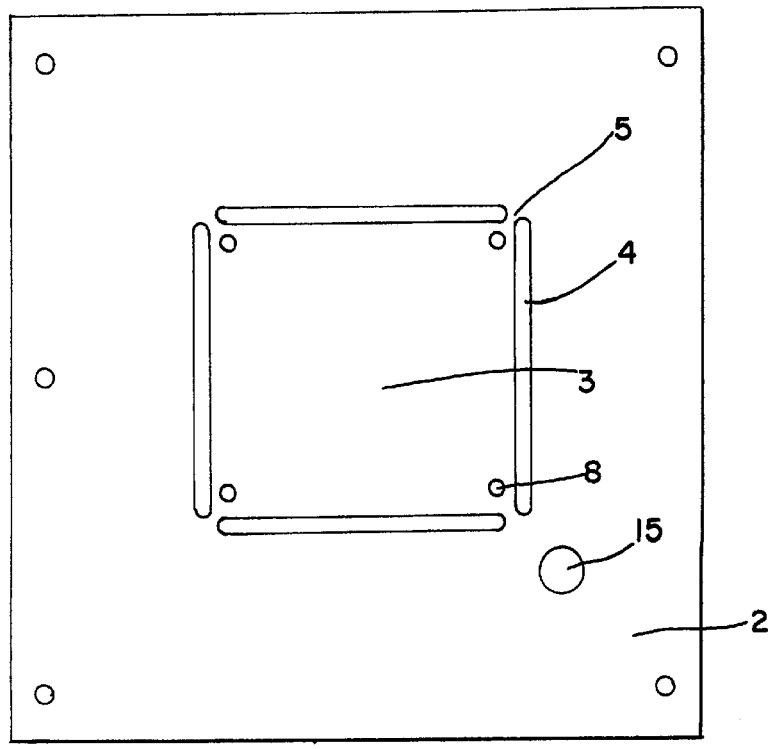
FIG. 2, a front elevation of the circuit board.

FIG. 1 shows the crystal oscillator design of the preferred embodiment of the invention. It comprises a hermetically sealed outer housing 1 inside which a circuit board 2 bearing all elements of the oscillator is located. A central part 3 of the circuit board 2 is separated from a peripheral part thereof by means of through cuts 4, both parts being connected at the ends of the cuts with narrow bridging strips 5 (shown in FIG. 2). All thermostatically controlled elements 16 of the oscillator are concentrated in the central part 3 of the circuit board 2. The outer housing 1 holds inside an inner case 6. The inner case 6 is shaped as an inverted open box and is made of material that is an excellent heat conductor, such as copper or aluminium alloy. The bottom of the inner case 6 is tightly adjoined to the central part 3 of the circuit board 2. To improve the thermal contact between the inner case 6 and the circuit board 2 a layer 7 of a heat conductive glue is placed therebetween. The inner case 6 is fixed to the circuit board 2 by rods 8. Material of the rods 8 must be an excellent heat conductor, such as copper. These heat-conducting rods 8 go through the central part 3 of the circuit board 2 in close proximity to each bridging strip 5 (as can be seen from FIG. 2). The ends of the heat-conducting rods 8 extend from the opposite side of the central part 3 of the circuit board 2. A crystal resonator in a separate casing 9 is fixed to the inner side on the bottom of inner case 6. Heating elements 10, such as transistors, and a first, main, temperature detector 11 are attached to the side walls of the inner case 6.

The open side of the inner case 6 is preferably covered with a thin cover 12. The cover is made of a heat conducting material, preferably copper, and the thickness of this cover does not exceed 0.5 mm. This cover is fixed with screws that hold the heating elements 10. There is a heat-insulating space, or gap, between the resonator body and the cover 12.

A thin copper cover 13 is attached to those ends of the heat-conducting rods 8 that extend from the opposite side of the central part 3 of the circuit board 2. All the thermostatically controlled elements 16 of the oscillator system are located in the central part 3 of the circuit board 2. There is a heat-insulating space between the cover 13 and the elements 16 of the oscillator system.

The empty space inside the outer housing 1 and the inner case 6 is filled with heat insulation 14.

Figure 3:
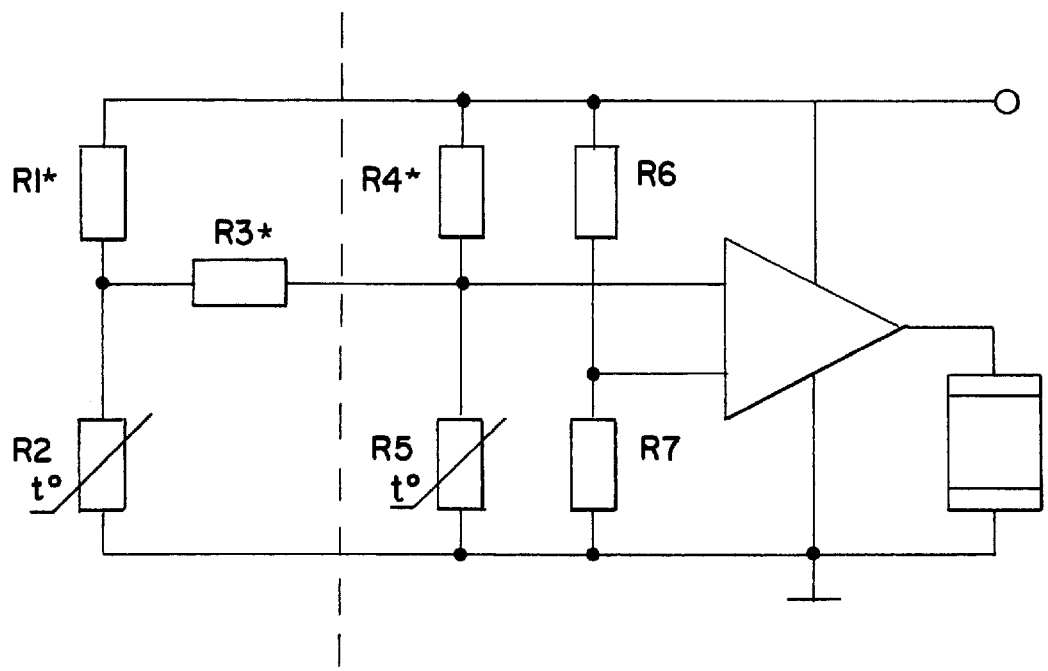
FIG. 3, an electric circuitry of the thermosensitive bridge.

In the preferred embodiment of the invention illustrated by FIGS. 1 and 3 the thermostatic regulator is designed using a bridge principle. A thermosensitive bridge circuit of the thermostatic regulator consists of:

a fixed arm with resistors $R_6$, $R_7$ having fixed resistance, a main thermosensitive arm with a first, main temperature detector 11 constituted by a temperature-sensitive resistor (thermistor) $R_5$ (see FIG. 3) and with a specially selected resistor $R^*_4$, and an additional thermosensitive arm with an additional temperature detector 15 constituted by a thermistor marked as $R_2$ in the FIG. 3 and a fixed value resistor $R_1$. The additional thermosensitive arm is coupled to the main thermosensitive arm by a coupling resistor $R^*_3$ having a fixed resistance.

The additional temperature detector 15 is mounted on the peripheral part of the circuit board 2. The through cuts 4 in the circuit board 2 thermally insulate the central part 3 of the circuit board 2 from its peripheral part, which guarantees temperature difference of more than 0.5° C. between these parts.

The thermostatically controlled oscillator according to the present invention functions as follows. The main part of total heat flow generated by the transistor heaters 10 is spreading by the following route: the heater 10—a side wall of the case 6—the rods 8—the bridging strips 5—the peripheral part of the circuit board 2—the outer housing 1—surrounding medium. Owing to the symmetry of the design, all rods 8 have the same temperature. Consequently, the bottom of the inner case 6 is only subject to that part of the heat flow which travels as follows: the bottom of the inner case 6—the central part 3 of the circuit board 2—the heat insulation 14—the outer housing 1—surrounding medium. The heat can also travel along another route: the bottom of the inner case 6—the resonator casing 9—the heat insulation 14—the outer housing 1—surrounding medium. In both latter instances, there is the heat insulation 14 in the way of the heat flow, so the heat flow along corresponding routes will be quite insignificant. Installation of the covers 12 and 13 will further decrease those flows.

Mathematical analysis of a performance of a thermostatic regulator with a thermosensitive bridge circuit as described above shows that it is possible to achieve, with the correct tuning of the bridge circuit, the temperature accuracy in the range of 0.01° C.–0.05° C., even if the static error of the thermostatic regulator and its design static error (the difference in temperatures between the crystal resonator and the heater) are of the order of 0.5° C.

During tests of the crystal oscillator model made according to the preferred embodiment of the invention on the base of a quartz crystal of SC-cut in a HC-37 case (produced by the Israeli Company NEL), the following results were obtained:

| | |
|---|---|
| Temperature stability | ±4 × 10⁻¹⁰ |
| Accuracy of thermostatic stabilisation (evaluated by measuring a frequency in the B mode) within temperature interval from −20° C. to +70° C. | +0,02° C. −0,01° C. |
| Power consumption (at 25° C.) | 1,5 V |
| Overall size | 51 × 41 × 19 mm |

Thus, the temperature stability of the order of $\pm 1 \times 10^{-9}$ and higher can be provided with the oscillator of the invention without using a double thermostatic circuit.

Though only one of the preferred embodiments of the present invention has been described in detail, the scope of the present invention is determined only by the attached claims and covers all multiple embodiments and modifications of the invention, which will be obvious to those skilled in the art. For example, according to one alternative embodiment, the thermostatically controlled oscillator of the invention is built with use of only one main temperature detector provided in the main thermosensitive arm of the thermosensitive bridge circuit. With moderate demands on the precision of stabilisation, the oscillator can be designed without the use of the heat conductive covers 12 and 13, or the layer 7 of glue could be substituted with another suitable material with a high thermal (or heat) conductivity, and so on.

What is claimed is:

1. A thermostatically controlled quartz crystal oscillator, comprising an outer housing (1) and a circuit board (2), which board comprises:
   a central part (3) carrying all thermostatically controlled elements of the oscillator, including a crystal resonator in a separate casing (9) and a thermostatic regulator with heating elements (10) and a temperature detector (11), and
   a peripheral part separated from the central part (3) of the circuit board (2) by means of through cuts (4), both parts being connected at the ends of the cuts (4) by narrow bridging strips (5),
   characterised in that
   the crystal resonator in the separate casing (9) is mounted on the bottom of an inner case (6), wherein said inner case
   is made of material that is an excellent heat conductor,
   is shaped as an inverted open box tightly adjoined by its bottom to the circuit board (2), and
   is supplied with heat conductive rods (8), said rods passing through the central part (3) of the circuit board (2) in close proximity to the narrow bridging strips (5), and in that
   the heating elements (10) and temperature detector (11) are mounted on the outer side walls of the inner case (6).

2. The thermostatically controlled crystal oscillator according to claim 1, characterised in that
   the open side of the box (6) is covered with a thin cover (12) made of material of a high thermal conductivity, and a heat-insulating space is provided between the cover (12) and the crystal resonator casing (9).

3. The thermostatically controlled crystal oscillator according to claim 1, characterised in that
   the rest of the thermostatically controlled elements (16) are mounted on the opposite side of the circuit board (2),
   a cover (13) is attached to the ends of the heat-conducting rods (8) extending from the opposite side of the circuit board (2),
   a heat-insulating space is provided between the cover (13) and the thermostatically controlled elements located on the surface of the circuit board (2), and
   the cover (13) is made of material of a high thermal conductivity.

4. The thermostatically controlled crystal oscillator according to claim 1, characterised in that
   a layer (7) of thermally conductive glue is provided between the bottom of the inner case (6) and the circuit board (2).

5. The thermostatically controlled crystal oscillator according to claim 1, characterised in that
   the thermostatic regulator is designed as a thermosensitive bridge circuit with a reference arm and a main thermosensitive arm comprising
   a temperature detector (11), and an additional thermosensitive arm comprising an additional temperature detector (15), wherein said additional arm is coupled to the main thermosensitive arm by a coupling resistor, and
   in that the said additional temperature detector (15) can be installed at any point of the oscillator, on condition that the temperature at this point (taken under normal outside conditions) is lower than the temperature of the crystal resonator at least by 0.5° C.

6. A thermostatically controlled quartz crystal oscillator comprising an outer housing (1) and a circuit board (2), which board comprises:
   a central part (3) carrying all thermostatically controlled elements of the oscillator, including a crystal resonator in a separate casing (9) and a thermostatic regulator with heating elements (10) and a thermosensitive bridge circuit with a reference arm and a main thermosensitive arm comprising a main temperature detector (11), and
   a peripheral part, separated from the central part (3) of the circuit board (2) by means of through cuts (4), both parts being connected at the ends of the cuts (4) by narrow bridging strips (5),
   characterised in that
   said thermosensitive bridge circuit comprises an additional thermosensitive arm comprising an additional temperature detector (15), wherein said additional arm is coupled to the main thermosensitive arm by a coupling resistor, and in that
   the aforesaid additional temperature detector (15) can be installed at any point of the oscillator, on condition that the temperature at this point (taken under normal outside conditions) is lower than the temperature of the crystal resonator at least by 0.520 C.

7. The thermostatically controlled crystal oscillator according to claim 6, characterised in that
   the crystal resonator in the separate casing (9) is mounted on the bottom of an inner case (6), wherein said inner case:
   is made of material that is an excellent heat conductor,
   is shaped as an inverted open box firmly fixed by its bottom to the circuit board (2), and
   is supplied with heat conductive rods (8), said rods passing through the central part (3) of the circuit board (2) in close proximity to the narrow bridging strips (5), the heating elements (10) and temperature detector (11) are mounted on the outer side walls of the inner case (6), and the rest of the thermostatically controlled elements (16) are mounted on the opposite side of the circuit board (2).

8. The thermostatically controlled crystal oscillator according to claim 7, characterised in that the open side of the box (6) is covered with a thin cover (12) made of a material of high thermal conductivity, and a heat-insulating space is provided between the cover (12) and the crystal oscillator casing (9), a cover (3) is attached to the ends of the heat-conducting rods (8) extending from the opposite side of the circuit board (2), a heat-insulating space is provided between the cover (13) and the thermostatically controlled elements located on the surface of the circuit board (2), and the cover (13) is made of material of a high thermal conductivity.

9. A thermostatically controlled quartz crystal oscillator comprising an outer housing (1) and a circuit board (2), which board comprises:

a central part (3) carrying all thermostatically controlled elements of the oscillator, including a crystal resonator in a separate casing (9) and a thermostatic regulator with heating elements (10) and a thermosensitive bridge circuit with a reference arm and a main thermosensitive arm comprising a main temperature detector (11), and a peripheral part, separated from the central part (3) of the circuit board (2) by means of through cuts (4), both parts being connected at the ends of the cuts (4) by narrow bridging strips (5), characterised in that the crystal resonator in the separate casing (9) is mounted on the bottom of an inner case (6), wherein said inner case:
is made of material that is an excellent heat conductor,
is shaped as an inverted open box firmly fixed by its bottom to the circuit board (2), and
is supplied with heat conductive rods (8), said rods passing through the central part (3) of the circuit board (2) in close proximity to the narrow bridging strips (5), the heating elements (10) and temperature detector (11, $R_5$) are mounted on the outer side walls of the inner case (6), the rest of the thermostatically controlled elements (16) are mounted on the opposite side of the circuit board (2);

the open side of the box (6) is covered with a thin cover (12) made of material of a high thermal conductivity, and a heat-insulating space is provided between the cover (12) and the crystal oscillator casing (9), a cover (13) is attached to the ends of the heat-conducting rods (8) extending from the opposite side of the circuit board (2), a heat-insulating space is provided between the cover (13) and the thermostatically controlled elements located on the surface of the circuit board (2), and the cover (13) is made of material of a high thermal conductivity the thermosensitive bridge circuit comprises an additional thermosensitive arm comprising
an additional temperature detector (15), wherein said additional arm is coupled to the main thermosensitive arm by a coupling resistor, and in that the said additional temperature detector (15) can be installed at any point of the oscillator, on condition that the temperature at this point (taken under normal outside conditions) is lower than the temperature of the crystal resonator at least by 0.5° C.

the thermosensitive bridge circuit comprises an additional thermosensitive arm comprising an additional temperature detector (15), wherein said additional arm is coupled to the main thermosensitive arm by a coupling resistor, wherein said additional temperature detector (15) can be installed at any point of the oscillator, on condition that the temperature at this point (taken under normal outside conditions) is lower than the temperature of the crystal resonator at least by 0.5° C.

* * * * *